United States Patent
Eo et al.

(10) Patent No.: US 7,893,786 B2
(45) Date of Patent: Feb. 22, 2011

(54) PARALLEL-STRUCTURED SWITCHED VARIABLE INDUCTOR CIRCUIT

(75) Inventors: Yun-seong Eo, Suwon-si (KR); Hee-mun Bang, Seoul (KR); Kwang-du Lee, Suwon-si (KR); Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 714 days.

(21) Appl. No.: 11/353,965

(22) Filed: Feb. 15, 2006

(65) Prior Publication Data

US 2006/0181363 A1    Aug. 17, 2006

(30) Foreign Application Priority Data

Feb. 15, 2005    (KR) .................... 10-2005-0012415

(51) Int. Cl.
*H03B 5/12*    (2006.01)
(52) U.S. Cl. ........................ 331/181; 331/167
(58) Field of Classification Search ............. 331/167, 331/181
See application file for complete search history.

(56) References Cited

U.S. PATENT DOCUMENTS

| 1,857,055 | A | | 5/1932 | MacDonald | |
|---|---|---|---|---|---|
| 5,227,962 | A | * | 7/1993 | Marsh | ........................ 363/39 |
| 5,872,489 | A | | 2/1999 | Chang et al. | |
| 6,002,303 | A | | 12/1999 | Carralero et al. | |
| 6,255,913 | B1 | | 7/2001 | Wang | |
| 2005/0068146 | A1 | * | 3/2005 | Jessie | ........................ 336/200 |
| 2006/0071732 | A1 | * | 4/2006 | Komurasaki et al. | ........ 331/167 |
| 2006/0097811 | A1 | * | 5/2006 | Nakamura et al. | .......... 331/167 |

OTHER PUBLICATIONS

J. W. Miller Magnetics: "Multi-6 Pack, Inductors and Transformers" [Online] Nov. 24, 2004, XP002388142 Retrieved from the Internet: URL: http://web.archive.org/web/20041124061412/www.jmiller.com/pdf2/PM600.pdf>, pp. 1, 3.

* cited by examiner

*Primary Examiner*—Joseph Chang
(74) *Attorney, Agent, or Firm*—Sughrue Mion, PLLC

(57) ABSTRACT

An inductor circuit includes a pair of inductors connected in parallel with each other and a switch for turning on and off electric power to one of the pair of inductors. The inductance of the inductor circuit can be varied and the quality factor Q can be improved. Further, RF circuits employing the inductor circuit can generate an intended operating frequency.

1 Claim, 4 Drawing Sheets

PARALLEL-STRUCTURED SWITCHED VARIABLE INDUCTOR CIRCUIT

CROSS-REFERENCE TO RELATED APPLICATIONS

This application claims benefit under 35 U.S.C. §119 from Korean Patent Application 2005-12415, filed on Feb. 15, 2005, the entire contents of which are incorporated herein by reference.

BACKGROUND OF THE INVENTION

1. Field of the Invention

The present invention relates to an inductor circuit, and more particularly to a parallel-structured inductor circuit which has an improved quality factor Q and is optimized at operating frequencies due to variable inductance.

2. Description of the Related Art

In general, center-frequency-variable radio frequency (RF) circuits are needed in wide-band communication systems such as televisions, ultra wide band, and the like, and in multi-band communication systems such as mobile phones, personal communication service (PCS), wide-band code-division multiple access (WCDMA), and the like, which can support multiple bands.

The frequency-tunable RF bandpass filter is one of such RF circuits capable of reducing power consumption with much less strict requirements of the linear characteristics of RF circuits and the phase noise of local oscillators since the filter enables a user to select his or her intended channels in RF bands and removes interference signals outside the intended bands as well as interfere signals from neighboring channels.

In order to change operating frequencies, such conventional frequency-tunable RF bandpass filters, amplifiers, mixers, voltage-controlled oscillators (VCOs), or the like, use voltage-controlled varactors controlled with an analog tuning signal or switched capacitors with capacitors connected in parallel with each other for switching. However, there exists a disadvantage to such a method of varying operating frequencies by changing capacitance due to a narrow variable range of operating frequencies, poor noise characteristics, and degraded oscillation performance. In particular, the VCOs require a scheme of varying the center frequency by using inductors in order to optimize the phase noise.

Thus, there has been a scheme using inductors for varying operating frequencies by changing inductance. FIG. 1 is a circuit diagram for showing a VCO having a modified inductor structure developed by the University of Florida in 2001. As shown in FIG. 1, a two inductors L3 and L4 are connected in series, and the inductor L3 is connected in parallel with a switch M4. The inductors L3 and L4 are small in size, have inductance optimized at high operating frequencies when the switch M4 is turned off and have inductance optimized at low operating frequencies when the switch M4 is turned on. However, such a VCO circuit has a disadvantage of difficulties in optimization at low frequencies since the capacities of the inductors L3 and L4 are small and the VCO circuit is optimized at high operating frequencies if the two inductors L3 and L4 are in operation. Further, the VCO circuit has a disadvantage of degrading its quality factor Q indicating the inductor performance since resistance of the switch M4 has influence on the inductor M4 connected in parallel therewith when the switch M4 is turned on.

Further, FIG. 2 is a circuit diagram for showing an inductor structure disclosed in U.S. Pat. No. 6,549,096 entitled "Switched inductor/varactor tuning circuit having a variable integrated inductor". A pair of inductors L5 and L6 each forming a separate circuit is connected in parallel with each other and a switch is connected to the inductor L5 to which electric power is not supplied. If the switch is opened, the inductor L5 has inductance optimized at high frequencies. If the switch is closed (turned on), electric current is induced in the opposite direction to that of the inductor L6 by the inductor L6 connected to the switch. Thus, since eddy current is generated between the inductors L5 and L6, resistance increases and inductance decreases. Accordingly, the inductor structure shown in the prior art 2 has a disadvantage of considerably degrading the quality factor Q as the resistance increases.

Thus, an alternative scheme is needed to enable the optimization at operating frequencies and the quality factor (Q) improvement by providing a new inductor structure to vary inductance.

SUMMARY OF THE INVENTION

An aspect of the present invention is to provide an inductor circuit capable of varying inductance to be optimized at operating frequencies as well as of improving the quality factor Q.

According to an aspect of the present invention, there is provided an inductor circuit, comprising a pair of inductors connected in parallel with each other; and a switch for turning on and off electric power to one of the inductors.

The inductors are supplied with electric power from one electric power source. The switch can be one of metal oxide semiconductor field-effect transistors (MOSFETs), metal-semiconductor field effect transistors (MESFETs), high electron mobility transistors (HEMTs), and diodes.

If the switch is turned on, mutual inductance occurs between the inductors so that an entire inductance can increase and an operating frequency can increase.

If the switch is turned off, inductance occurs in one of the inductors so that an operating frequency decreases.

BRIEF DESCRIPTION OF THE DRAWINGS

The above and/or aspects of the present invention will be more apparent by describing certain exemplary embodiments of the present invention with reference to the accompanying drawings, in which:

FIG. 8 is a graph for showing oscillation frequencies generated from the VCO of FIG. 6 in a state that the switch is turned on.

DETAILED DESCRIPTION OF THE EXEMPLARY EMBODIMENTS

Hereinafter, the present invention will be described in detail with reference to the accompanying drawings.

Figure 3:
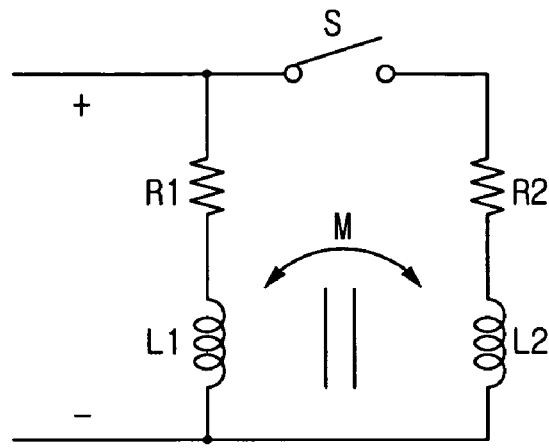
FIG. 3 is a circuit diagram for showing a parallel-structured switched variable inductor according to an exemplary embodiment of the present invention.

FIG. 3 is a diagram for showing a parallel-structured switched variable inductor circuit according to an exemplary embodiment of the present invention. As shown in FIG. 3, the inductor circuit has a pair of first and second inductors L1 and L2 connected in parallel with each other and a switch S turning on and off the second inductor L2. A pair of resistors R1 and R2 are connected in series to the first and second inductors L1 and L2, respectively.

In here, the switch S can be a switching device formed with semiconductor devices, such as an MOSFET, an MESFET, an HEMT, diodes, and so on.

The first and second inductors L1 and L2 generate a different inductance, respectively, in the state that such a switch S is turned on or off. If the switch S is turned off, electric current flows only in the first inductor L1, and inductance occurs with a size of the first inductor L1, and the inductance is optimized at low operating frequencies of the operating frequencies. If the switch S is turned on, current is divided into the first and second inductors L1 and L2, and the first and second inductors L1 and L2 have inductance, respectively. In here, the first and second inductors L1 and L2 are connected in parallel with each other and the currents in the both inductors L1 and L2 flow in the same direction, so mutual inductance M occurs. Thus, in the state that the switch S is turned on, inductance occurs which can be expressed in Equation 1 as below:

$$L_{on} = \frac{L_1 L_2 - 2M^2}{L_1 + L_2 - 2M} \quad \text{[Equation 1]}$$

where the mutual inductance M can be expressed in Equation 2 as below:

$$M = k\sqrt{L_1 L_2}. \quad \text{[Equation 2]}$$

If the first and second inductors L1 and L2 have the same size in Equation 1, inductance can be expressed in Equation 3 as below:

$$R_{on} = \frac{R}{2} \quad \text{[Equation 4]}$$

Therefore, it can be seen that, if the switch S is turned on, the inductance is proportional to an inductor size and mutual inductance M.

Further, if the switch S is turned on, resistance occurring across the first and second inductors L1 and L2 can be expressed in Equation 4 as below, if the sizes of the first and second inductors L1 and L2 are the same and the resistance values of first and second resistors R1 and R2 are the same:

$$L_{on} = \frac{L + M}{2} \quad \text{[Equation 3]}$$

Thus, it can be seen that the value of resistance across each inductor decreases as the first and second inductors L1 and L2 are connected in parallel with each other. Such a parallel connection of the first and second inductors L1 and L2 decreases the entire resistance and increases inductance by the mutual inductance, thereby bringing an effect of improvement of the quality factor Q. If the first and second inductors L1 and L2 have the same size and the resistance values of the first and second resistors are the same, the parallel connection of the first and second inductors L1 and L2 shows a distinct effect of the quality factor Q in high-frequency bands rather than in low-frequency bands when the quality factor Q at the high operating frequencies is compared to that at the low operating frequencies, and FIGS. 4 and 5 show the comparison result of the quality factors Q of the present invention and the conventional inductor structure.

Figure 1:
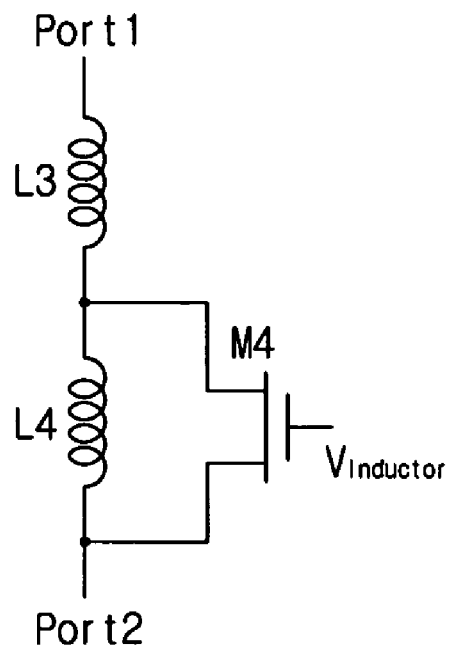
FIG. 1 is a diagram for showing a conventional VCO circuit having a modified inductor structure.
Figure 2:
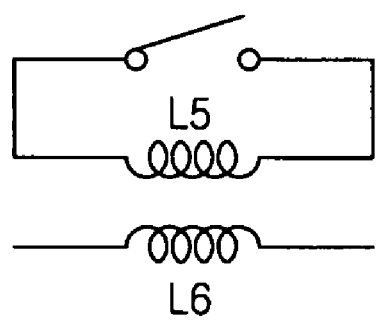
FIG. 2 is a diagram for showing an conventional inductor circuit disclosed in U.S. Pat. No. 6,549,096.
Figure 4:
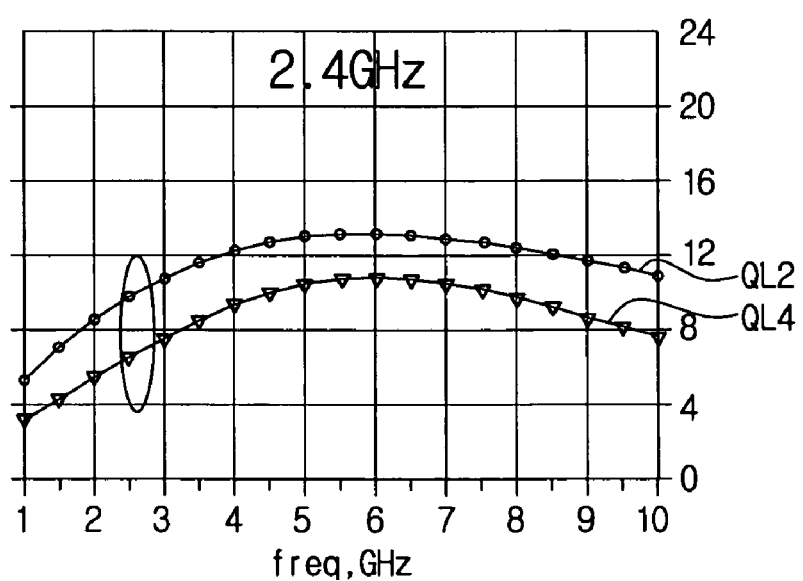
FIG. 4 is a graph for showing comparison of the quality factor Q of the inductor circuit of FIG. 3 to that of the conventional inductor circuit of FIG. 1 at a frequency band of 2.4 GHz.
Figure 5:
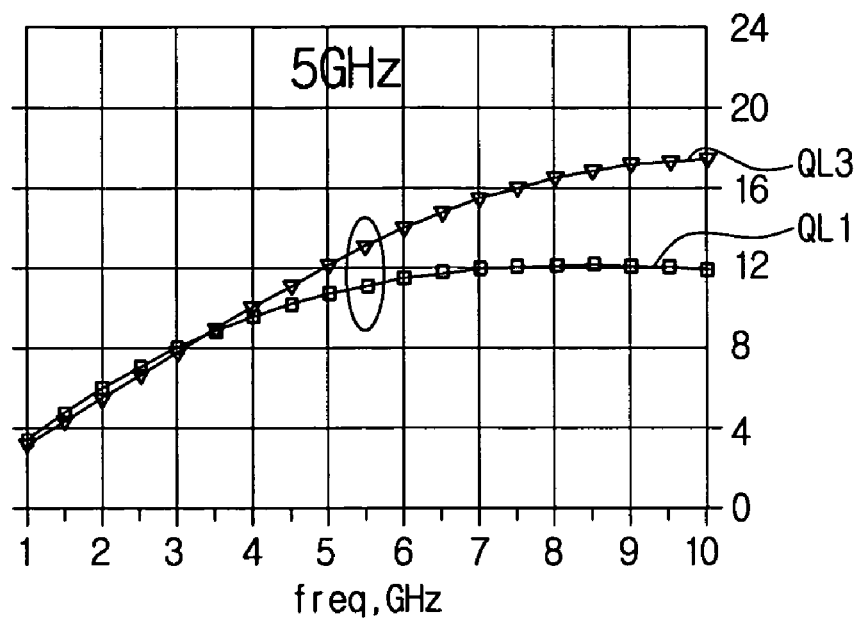
FIG. 5 is a graph for showing comparison of the quality factor Q of the inductor circuit of FIG. 3 to that of the conventional inductor circuit of FIG. 1 at a frequency band of 5 GHz.

FIG. 4 is a graph for showing the comparison of the quality factor Q of the inductor circuit of FIG. 3 to that of the conventional inductor circuit of FIG. 1 at a frequency band of 2.4 GHz, and FIG. 5 is a graph for showing the comparison of the quality factors Q of the present invention and the conventional inductor circuits at a frequency band of 5 GHz.

As shown in FIG. 4, if the switch S is turned off, that is, if the operating frequency is 2.4 GHz, the quality factor Q (QL2) of the present inductor circuit is better than that of the conventional inductor circuit over the entire frequency bands. As shown in FIG. 5, if the switch S is turned on, that is, if the operating frequency is 5 GHz, the quality factor Q (QL1) of the present invention increases as frequency bands become higher, and maintains the same value from the frequency band of 5 GHz, which is smaller than the conventional quality factor Q (QL2) continuing to increase as the frequency bands become higher, but has no or little quality factor difference between the two if compared only at the frequency band of 5 GHz.

In view of such results shown in FIGS. 4 and 5, the present inductor has an overall improved quality factor Q compared to the conventional inductor, and, in particular, has a great effect on the improvement of the quality factor Q at low-frequency bands.

Figure 6:
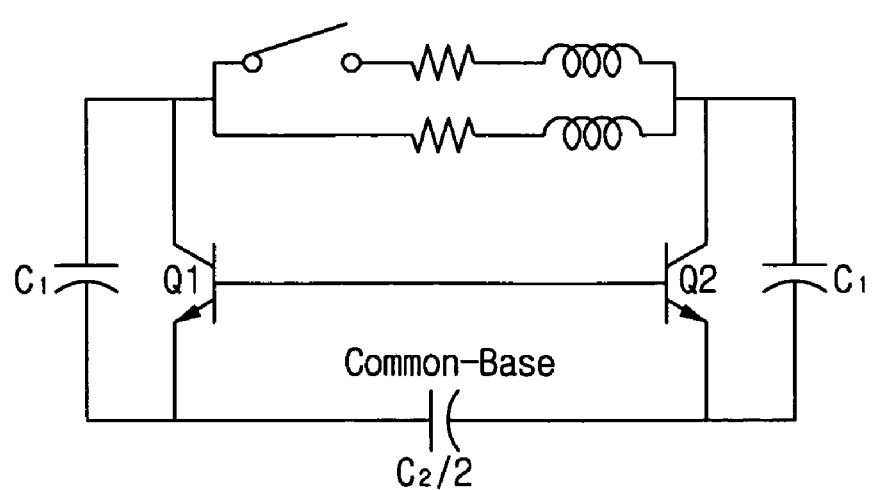
FIG. 6 is a diagram for showing a multi-band VCO circuit to which the inductor structure is applied according to an exemplary embodiment of the present invention.

Further, FIG. 6 is a diagram for showing a multi-band VCO circuit to which an inductor structure according to the present invention is applied.

A VCO is a variable-frequency oscillation circuit module that stably oscillates a transmission frequency and a reception local-oscillation frequency of handheld phones of mobile communication devices by an input voltage to the synthesizer.

The oscillation frequency of the VCO depends on a resonance frequency of a resonator, and, if the resonance frequency is manually changed from outside, the oscillation frequency bandwidth of the oscillator is changed with the variable band of the resonance frequency of the resonator. The LC resonator used in such a VCO is built with inductors and capacitors, and, conventionally, the variable capacitor (varactor) is mainly used to change the resonance frequency, but the present VCO uses inductors to change the resonance frequency.

The present VCO contains an inductor circuit having a pair of inductors connected in parallel with each other and switches for turning on and off one of the pair of inductors.

Figure 7:
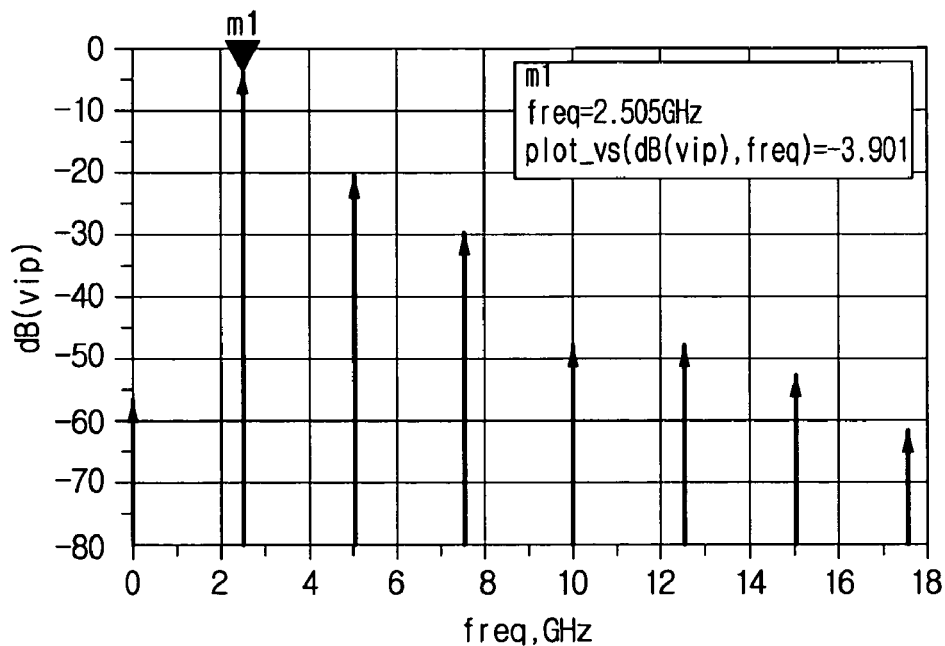
FIG. 7 is a graph for showing oscillation frequencies generated from the VCO of FIG. 6 in a state that the switch is turned off.
Figure 8:
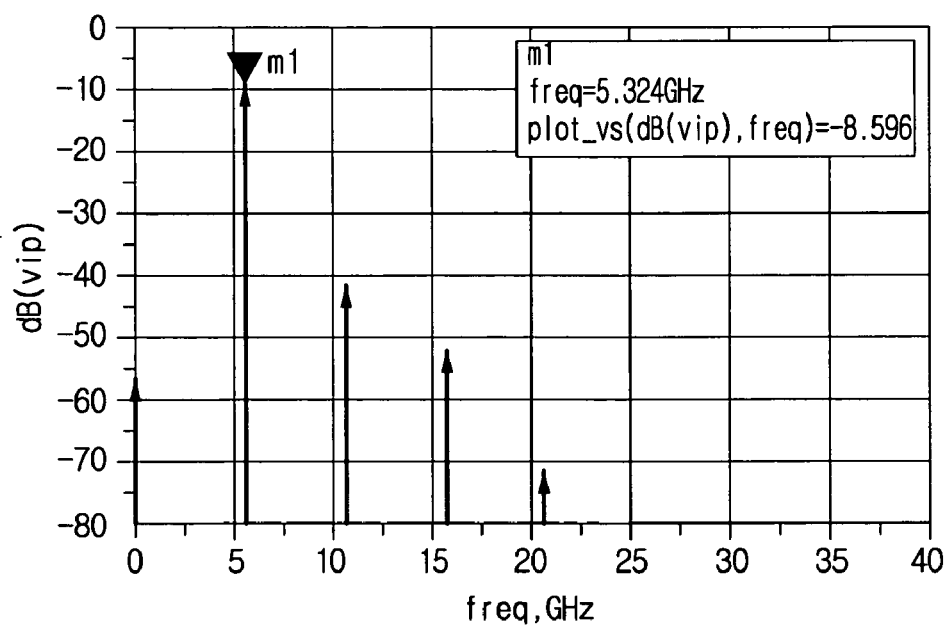

As shown in FIG. 7, if the switch is turned off, such a VCO generates an oscillation frequency of 2.4 GHz, and, as shown in FIG. 8, if the switch is turned on, the VCO generates an oscillation frequency of 5 GHz. That is, if the present inductor circuit is applied to a VCO, the VCO can oscillate at an intended frequency band.

As above, in the present inductor circuit, a pair of inductors is connected in parallel with each other, and the switch can turn on and off one of the pair of inductors so that inductance can vary. Thus, RF circuits employing the present inductor circuit can generate an intended operating frequency. Further, the present inductor circuit decreases its resistance value and increases its inductance since the inductors therein are connected in parallel with each other, so as to improve the quality factor Q, in particular, at low-frequency bands.

Further, such an RF circuit can be applied to the RF circuits for amplifiers, mixers, and so on, in addition to VCOs.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An inductor circuit comprising:
   a first inductor circuit;
   a second inductor circuit which is connected in parallel with the first inductor circuit; and
   only one switch which turns on and off electric power to one of the first and second inductor circuits,
   wherein the first inductor circuit comprises an inductor and a resistor connected in series to each other, and the second inductor circuit comprises an inductor and a resistor connected in series to each other,
   wherein the two inductors in the first and second inductor circuits have a same size, and the two resistors in the first and second inductor circuits have a same resistance value, and
   wherein the first and second inductor circuits do not include any capacitor.

* * * * *